United States Patent [19]

Evans et al.

[11] Patent Number: 4,506,171
[45] Date of Patent: Mar. 19, 1985

[54] LATCHING TYPE COMPARATOR

[75] Inventors: William P. Evans, Glen Burnie, Md.; Robert J. McCabe, Norristown, Pa.; Eric H. Naviasky, Baltimore, Md.

[73] Assignee: Westinghouse Electric Corp., Pittsburgh, Pa.

[21] Appl. No.: 454,215

[22] Filed: Dec. 29, 1982

[51] Int. Cl.³ .................. H03K 5/08; H03K 19/086
[52] U.S. Cl. .................................. 307/362; 307/354; 307/530; 307/494; 307/455
[58] Field of Search ............... 307/268, 350, 562, 354, 307/455, 494, 530

[56] References Cited

U.S. PATENT DOCUMENTS

| 3,694,668 | 9/1972 | Foerster | 307/362 |
| 3,728,560 | 4/1973 | Treadway | 307/362 |
| 3,818,250 | 6/1974 | Reed et al. | 307/362 |
| 4,147,943 | 4/1979 | Peterson | 307/355 |

*Primary Examiner*—Stanley D. Miller
*Assistant Examiner*—Loha Ben
*Attorney, Agent, or Firm*—W. E. Zitelli

[57] ABSTRACT

An improved latching-type comparator operative in a selected one of two exclusive states is disclosed. In one state, the operational state, a gain stage is rendered operative to amplify at least one intermediate current signal generated by an input stage in response to the comparison of a pair of input signals. At least one drive current signal is generated by the gain stage in response to the comparison and is buffered by a corresponding buffer stage to render both an output signal and a signal representative thereof. In the other state, a latch stage is rendered operative unresponsive to the comparison and governed by the signal representative of the output signal to sustain the drive current signal in a state to latch the output signal. A switching stage governed by at least one latch signal effects the selection between the gain and latch stages by conducting operating current exclusively from the selected stage to a constant current stage. An independent second constant current stage provides current for the input stage to maintain its operation continuously independent of the selected date of the comparator.

10 Claims, 12 Drawing Figures

LATCHING TYPE COMPARATOR

BACKGROUND OF THE INVENTION

The present invention relates to electronic comparators in general, and more particularly to an improved latching type comparator.

In radars and ECM systems and the like, analog input data is generally gathered over very small intervals of time, like on the order of a millisecond or so. Modern systems of this type tend to divide the input data interval into much smaller data samples, and convert these analog data samples into digital numbers representative thereof for post processing purposes in a digital signal processor or digital computer. A high speed analog-to-digital (A/D) converter is used for the conversion operation. The current trend is to require these A/D converters to have increasingly higher conversion rates and greater resolution (i.e. more bits in the converted digital word).

Normally, the basic building block of this type converter is of the "parallel" or "flash" type variety in which a bank of $2^N-1$ comparators compare the analog input signal to a series of reference voltages usually generated by a reference ladder resistor network with $2^N-1$ taps. In this manner, each analog signal sample is converted into a thermometer coded word appearing at the output of the bank of comparators. Each thermometer coded word may then be converted to another digital code, like a gray or binary code as the case may be, using appropriately chosen logic circuitry.

The number of comparators required in the type of converter just described is based on the bit resolution required thereof. For example, for a 3-bit converter, 7 comparators are needed; and for a 4-bit, 15 comparators are needed. Theoretically, the number of comparators required doubles with each 1-bit increase in resolution. Therefore, because of the shear numbers of comparators required for a reasonable number of bits of resolution, much emphasis is placed on the design of the comparator. Key features which are primarily considered include highspeed, low power, large analog input voltage range, ECL compatibility of latch clock inputs, and surface area of silicon substrate needed to implement the comparator bank in a semiconductor monolithic form. An improvement in any or all of these key areas will in effect be multiplied by the number of comparators used.

One type of high speed latching comparator suitable for use in a flash or parallel variety A/D converter, supra, is described in U.S. Pat. No. 4,147,943, issued Apr. 3, 1979 to James G. Peterson. This type comparator makes use of a gain stage to amplify the difference between the analog voltages being compared at the input stage when the comparator is in a follow mode, and a latching stage to sustain the output voltage independent of the analog input voltages when the comparator is in a latch mode. The latch and follow modes are selected exclusively by a switching circuit governed by input clocking signals. More particularly, the switching circuit renders the gain and input stages operative concurrently by drawing current therefrom to a single fixed current drain when the follow mode is selected, and renders the latching circuit operative by drawing current therefrom to the same current drain when the latch mode is selected.

One drawback of this type comparator is that the input stage is rendered inoperative during the latch mode. Time is wasted in returning the input stage to an operational state when the follow mode is reselected which, in effect, increases the response time in the process of sampling input signal comparisons. Another drawback is that the output lines are provided to the latching circuit directly. These output lines are generally relatively long and include a proportional amount of distributed capacitance. The line capacitance may cause a slower response in the comparator outputs to the comparisons occurring at the input stage thereof. In other words, time is wasted in the charging and discharging of the line capacitance creating a response delay between the input and output of the comparator. Under these conditions, the outputs may not always be in a state to represent accurately the comparative input state when the latch mode is selected. These and other undesirable features of the present comparators are believed improved upon by the inventive aspects of Applicants' comparator embodiment.

SUMMARY OF THE INVENTION

A latching-type comparator is operative in one state to generate at least one output signal in response to a comparison of a pair of input signals and is operative in another state to secure the state of the output signal unresponsive to the comparison of the input signals. The comparator comprises an input stage, a first constant current stage, a gain stage, a latch stage, a switching stage, a second constant current stage and at least one buffer stage. The input stage is governed by the pair of input signals to generate at least one intermediate current signal representative of the comparison of the input signals. The first constant current stage provides operational current continuously for the input stage. The gain stage is selectively operative in response to the generated intermediate signal to generate a drive current signal which is an amplification of the intermediate current signal. The latch stage is selectively operative to sustain the generated drive current signal according to the state of the output signal independent of the generated intermediate current signal. The second constant current stage provides a fixed amount of operational current which is independent of said first constant current stage. The switching stage is governed by at least one latch signal to operate between two mutually exclusive states. In one state, the gain stage is rendered operative by conducting current between said gain stage and said second constant current stage and in the other state, the latch stage, is rendered operative by conducting current between said latch stage at said second constant current stage. The at least one buffer stage buffers the drive signal to generate the output signal.

More specifically, the latch stage is coupled to the buffer stage and once selected for operation is governed by a signal, generated by the buffer stage and representative of the output signal, to sustain the drive current signal in the state for latching the output signal. In addition, the buffer stage includes dual generating means, driven commonly by the drive current signal, to generate both the output signal and the signal representative thereof for feedback to the latch stage.

Still further, the buffer stage includes a means for converting the drive current signal to a drive voltage signal, and a dual emitter transistor voltage follower stage for buffering the drive voltage signal to form both the output signal and signal representative thereof.

DESCRIPTION OF THE PREFERRED EMBODIMENT

Figure 1:
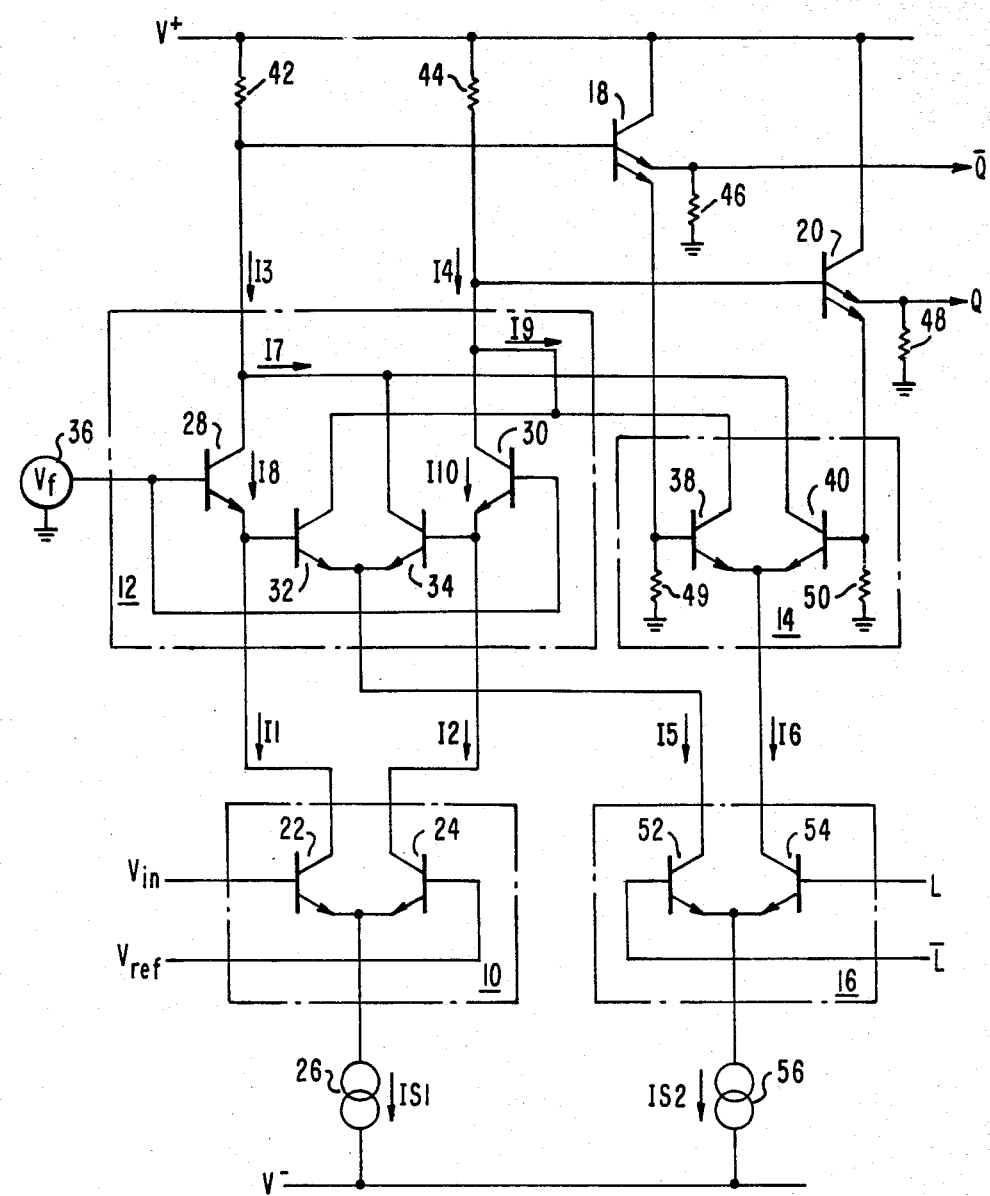
FIG. 1 is a circuit schematic diagram of a latching type comparator embodiment suitable for describing the principles of the present invention.

FIG. 1 depicts a circuit schematic diagram of a latching type comparator suitable for use in a comparator bank of a parallel or flash-type A/D converter. The comparator embodiment of FIG. 1 comprises an input stage 10, a gain stage 12, a latch stage 14, a switching stage 16, and at least one buffer stage, the transistor portion of which being shown at 18, 20 or a combination thereof. The input stage 10 includes a pair of transistors 22, 24 of the NPN-type connected together in a differential transistor pair arrangement. One analog input signal, denoted as $V_{in}$, may be coupled to the base of transistor 22 and another analog input signal, denoted as $V_{ref}$, may be coupled to the base of transistor 24. The emitters of transistors 22 and 24 are coupled to a negative voltage supply potential, denoted as $V^-$, through a conventionally structured constant current drain 26.

The gain stage 12 includes four transistors 28, 30, 32 and 34, all of an NPN-type, which may be arranged in a Gilbert gain cell structure. In this arrangement, the bases of transistors 28 and 30 are commonly coupled to a conventional reference voltage source, denoted as $V_f$, at 36. The collector of transistor 22 of the input stage 10 is coupled to the emitter and base of transistors 28 and 32, respectively. Similarly, the collector of transistor 24 is coupled to the emitter and base of transistors 30 and 34, respectively.

The latch stage 14 includes a differential pair of NPN-type transistors 38 and 40. Moreover, the collectors of transistors 28, 34 and 40 are commonly coupled to the base of the transistors 18, and also coupled to a positive voltage supply, denoted as $V^+$, through a resistive element 42. In a similar arrangement, the collectors of the transistors 32, 30 and 38 are commonly coupled to the base of the transistor 20 and also to the voltage supply $V^+$ through a resistive element 44.

In accordance with one aspect of the present invention, the transistors 18 and 20, each includes a dual emitter stage, and are configured as emitter follower transistors. One emitter of each of the transistors 18 and 20 is coupled to a reference potential, like ground potential, for example, through a resistor like that shown at 46 and 48, respectively. The other emitter of transistor 18 may be coupled to the base of transistor 38 and also coupled to the reference potential through resistor 49. Likewise, the other emitter of transistor 20 may be coupled to the base of transistor 40 and also coupled to the reference potential through a resistor 50. The voltages developed across resistors 46 and 48 are representative of the output signals denoted as $\overline{Q}$ and $Q$, respectively. In addition, the collectors of the transistors 18 and 20 are coupled commonly to the positive voltage supply $V^+$. Under the dual emitter buffer transistor structure, each buffer transistor 18, 20 generates two signals independently buffered, one being an output signal of the comparator and the other signal being representative thereof, but utilized as feedback in driving the base of its corresponding latch stage transistor.

The advantages of this structural arrangement will become more apparent from the operational description found hereinbelow.

The switching stage 16 also includes a differential pair of NPN transistors 52 and 54 which have their emitters commonly coupled to the negative voltage supply $V^-$ through a second constant current drain 56 which is of a conventional current arrangement. The bases of transistors 54 and 52 may be coupled respectively to the complementary latch clock signals, denoted as L and $\overline{L}$. The L signal signifying enablement or selectivity of latch operation and the $\overline{L}$ signal signifying disablement of latch operation. The collector of transistor 52 may be commonly coupled to the emitters of the gain stage transistors 32 and 34 and similarly, the collector of transistor 54 may be commonly coupled to the emitters of the latch stage transistors 38 and 40.

In the present embodiment described hereabove in connection with FIG. 1, the latching type comparator is operative in one state to generate at least one output signal in response to a comparison of a pair of input signals and operative in another state to secure the state of the output signal unresponsive to the comparison of the input signals. The input stage 10 is governed by the pair of input signals $V_{in}$ and $V_{ref}$ to generate at least one intermediate signal, preferably one of the collector current signals I1 or I2 of transistors 22 and 24, respectively, which is representative of the comparison of the input signals. The gain stage 12 which may be of a Gilbert gain cell arrangement is selectively operative in response to the generated intermediate signal to generate a drive signal which is an amplification of the intermediate signal. The drive signal is denoted as the current I3 or I4 passing through the resistor 42 or 44, respectively. In addition, the latch stage 14 is selectively operative to sustain the generated drive signal I3 or I4 according to the state of the input signal Q or $\overline{Q}$ independent of the generated intermediate signal I1 or I2. The switching stage 16 is governed by at least one latch signal L or $\overline{L}$ to operate between two mutually exclusive states, in one state the gain stage 12 is rendered operative preferably by conducting current I5 from the gain stage through the transistor 52, and in the other state the latch stage 14 is rendered operative, preferably by conducting current I6 from the latch stage 14 through the transistor 54. The comparator includes at least one buffer stage 18 or 20 for buffering the drive signal I3 or I4 to generate the output signal Q or $\overline{Q}$.

In accordance with another aspect of the present invention, the operational current for the gain stage 12 and latch stage 14 is conducted selectively to the second constant current drain 56 via switching circuit 56. However, the input stage 10 remains operational independent of the selected state because its operational current is provided constantly by the independent first constant current drain 26. Thus, even though the comparator may be switched to the latch state causing the outputs Q and $\overline{Q}$ to be independent of the comparisons performed at the input stage 10, the input stage 10 nevertheless remains operational. Other ways of looking at this is that the current drain 56 for the gain stage 12 is independent of the current drain 26 of the input stage 10; therefore, only the gain stage 12 is selected inoperative by switch 16 and the input stage 10 remains operative. The advantages of this circuit arrangement is that no time is wasted in returning the input stage to an operational state between selections as is the case in the present comparator type directed to in the previously referenced U.S. Pat. No. 4,147,943. Thus, the response time of the comparator in its sampling operations is decreased rendering a higher frequency comparator.

More particularly, in the preferred embodiment of FIG. 1 the input stage includes a differential pair of transistors 22 and 24 being driven by the respectively corresponding pair of input signals $V_{in}$ and $V_{ref}$ to generate two intermediate current signals I1 and I2. The intermediate current signal I1 being rendered greater than the intermediate current signal I2 in response to the comparison result of $V_{in}$ being greater than $V_{ref}$ and the current signal I2 being rendered greater than current signal I1 in response to the comparison result of the input signal $V_{ref}$ being greater than $V_{in}$. The Gilbert gain stage differential transistor structure 12, upon selection, amplifies the pair of intermediate current signals I1 and I2 to form a corresponding pair of current drive signals I3 and I4. The gain stage 12 is selected over the latch stage 14 by the switching stage 16 by enabling the conduction of I5 and disabling the conduction of I6.

Figure 2A:
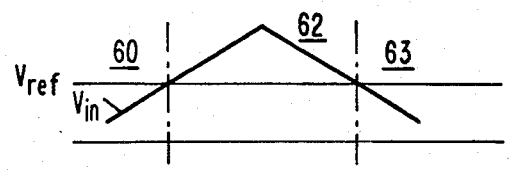
FIGS. 2A through 2K are graphical illustrations of appropriate chosen signals for use in describing a typical operation of the embodiment of FIG. 1.
Figure 2B:
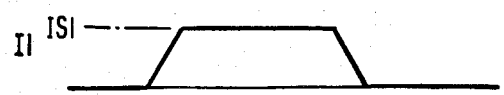
Figure 2C:

The graphs of FIGS. 2A through 2E depict illustratively the operation of the comparator embodiment during the time when the gain stage may be selected for operation. During the period denoted as 60, $V_{ref}$ is greater than $V_{in}$, rendering I2 greater than I1 as shown in FIGS. 2B and 2C. This combination renders the drive signal I4 greater than the drive signal I3 via gain stage 12, which, in turn, effects a voltage drop across resistor 44 greater than the voltage drop across resistor 42. The output signal $\overline{Q}$ is thus rendered higher in potential than the output signal Q as shown in the graphic illustrations of FIGS. 2D and 2E, respectively. Similarly, during the period of the graph denoted as 62 the input signal $V_{in}$ becomes greater than the input signal $V_{ref}$, thus causing I1 to be greater than I2, which ultimately renders I3 greater than I4. A voltage drop is thus effected across resistor 42 which is greater than the voltage drop across resistor 44. Under these conditions, the potential at the output Q is greater than the potential at the output $\overline{Q}$, which is also depicted in the graphical illustrations of 2D and 2E.

The latch stage 14 may be selectively enabled at any time during the operation of the comparator by the switching stage 16 by effecting a conduction of current I6 and disabling the conduction of current I5, which renders the gain stage 12 inoperative. In this state, the drive currents I3 and I4 are both sustained at their state upon the selection transistion.

More specifically, the conducting drive currents, I3 and I4 are each a composite of two currents; for example, for I3, these currents are denoted as I7 and I8 and likewise, for I4, these currents are denoted as I9 and I10. When the gain stage 12 is operative and responsive to the intermediate signals I1 and I2, then I8 conducting through transistor 28 is substantially equal to I1 and I10 conducting through transistor 30 is substantially equal to I2. The combined currents I1 and I2 are set by the constant current drain 26. In this condition, transistor 34 is driven by transistor 30 and transistor 32 is driven by transistor 28. As a result, I7 is conducted by transistor 34 and I9 is conducted by transistor 32. The combined currents I7 and I9 are set by the constant current drain 56 at Is2. In the present embodiment, the current drain Is2 is set on the order of 4 to 5 times the current drain Is1. Consequently, current I7+I8, or their composite I3, may be on the order of 5 times that of I1 or a current gain of approximately 5 in this example.

Figure 2D:
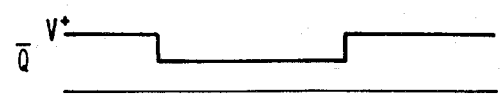
Figure 2E:
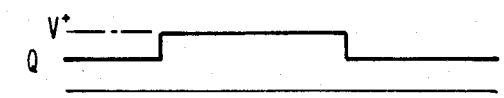
Figure 2F:
Figure 2G:
Figure 2H:
Figure 2I:
Figure 2J:
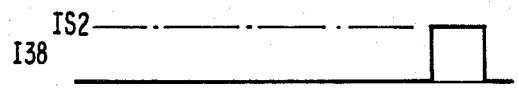
Figure 2K:

As exemplified in the graphical illustrations in FIGS. 2A through 2K, should a latch request be initiated in the period 62 as governed by the latch clock signals $\overline{L}$ and L (see FIGS. 2H and 2I), the current drain I5 from the gain stage 12 is blocked and the current drain I6 from the latch stage 14 becomes conductive. Under these conditions, note that the current flowing through the transistor 34, denoted as I34 in FIG. 2G, becomes nonconductive. Also note that during period 62 the output signal Q was greater than the output signal $\overline{Q}$, thus when the latch stage 14 is selected by enabling conduction of current I6 transistor 40 is switched on and transistor 38 is switched off as governed by the feedback signals, and the conduction of the current I7 is sustained through transistor 40, I40, instead of transistor 34. This phenomena is graphically illustrated in the FIGS. 2G and 2K in connection with the latch clock signals of FIGS. 2H and 2I. Alternately, with I2 greater than I1 as shown for the period 63 in the graphs of FIGS. 2A through 2K, the currents I8 and I10 conducted at transistors 28 and 30, respectively, become essentially that of currents I1 and I2. Also, since I1 is less than I2, transistor 32 is driven harder than that of transistor 34. With the gain stage selected operative, the current I9 is conducted through transistor 32, I32, and the composite of the currents I9 and I10 form the drive current I4 with essentially the same gain factor, supra. Under these conditions, I4 is greater than and I3, thus the output of $\overline{Q}$ is greater than the output of Q as shown in FIGS. 2D and 2E in period 63. Should a latch operation be initiated during period 63, the switching stage 16 will divert the current drain I5 from the gain stage 12 to I6 from the latch stage 14. Current will cease through transistors 28 and 32 and begin to flow through transistors 38 and 40 as governed by the feedback signals coupled thereto, refer to in the graphical illustrations of FIGS. 2F and 2J. The drive currents are thus sustained during this alternate comparison condition.

Several advantages are achieved through the operation of the present embodiment just described. For example, the input stage 10 is permitted continuous operation even throughout the output latching period to conduct current through the transistor designated by the difference of the input signals. Because of the magnitude of the current gain of the gain stage 12, a change in conduction between input transistors of the input stage will not appreciably affect the current drive signals I3 and I4 during the output latching period. This mechanization results in a much faster response time for the output signals to recover once switched from the latched to the unlatched state. Note also that the gain current portion of the drive signal is not discarded but rather taken up by the switching stage 16 from either the gain stage 12 or the latch stage 14 for operation thereof. In addition, cascading the transistor pairs 22 and 28, and 24 and 30 provide a reduction in the Miller capacitance of the input transistors 22 and 24, thus providing for even faster response times thereof.

Another improvement is found in the dual emitter transistor buffer stages 18 and 20 in which one emitter becomes the output and the other emitter becomes the feedback signal for the latch stage differential pair. The major advantage of this embodiment is that the loop speed of the comparator is maintained independent of the load line capacitance. Another advantage in this mechanization is that if the output should be loaded down for any reason it will have very little or no effect on the state of the feedback signal to the latch stage differential pair such that the drive signals will be sustained in their proper latch state until such output signal line overloading may be relieved, at which time the output signals will respond to the correct drive signals and be returned to their desired latched states. Still further, because of the mechanization of the switching stage in the described embodiment, the differential transistor pair 52 and 54 may be driven directly by latch clock inputs L and $\overline{L}$ at ECL voltage levels. As a result, no internal buffers or level shifting circuitry is needed. This results in a decrease in latch aperture uncertainty as well as a decrease in semiconductor die size and power dissipation. Still further yet, another advantage of the present mechanization is that is facilitates relatively large analog input signal ranges.

Experimentation has been performed in order to determine the performance of the comparator as described in connection with the embodiment of FIG. 1. Typically, the fixed current drains IS1 and IS2 were set at about 150 μA and 600 μA, respectively, the resistors 42 and 44 where both set at 1.2K, and the voltage supplys V+ and V− were set at +5 V and −5.2 v, respectively. Table 1 found herebelow provides values for key comparator performance parameters typical of those which were derived from the experiments performed.

TABLE 1

| | |
|---|---|
| Bandwidth (−3 dB Unlatched) | >200 Mhz |
| Power Dissipation | 20.7 mW |
| Input Bias Current | 2.5 μA |
| Comparator Area (Oat Transistors) | 200 mil$^2$ |
| Propagation Delay (Unlatch to Comparator Decision Point) | 2.0 ns |
| Voltage Gain (Unlatched) | 23 dB |

While the present invention has been described in connection with a specific embodiment such as that shown by the schematic circuit of FIG. 1, it is realized that other embodiments may be used or even additions and modifications may be made to the one described without deviating from the breadth and broad scope of the present invention as recited in the claims heretofollow.

We claim:

1. A latching type comparator operative in one state to generate at least one output signal in response to a comparison of a pair of input signals and operative in another state to secure the state of said output signal unresponsive to said comparison of the input signals, said comparator comprising:

an input stage governed by said pair of input signals to generate at least one intermediate current signal representative of the comparison of said input signals;

a first constant current stage for providing operational current continuously for the input stage;

a gain stage selectively operative in response to said generated intermediate current signal to generate a drive current signal which is an amplification of said intermediate current signal;

a latch stage selectively operative to sustain said generated drive current signal according to the state of said output signal independent of said generated intermediate current signal;

a second constant current stage for providing a fixed amount of operational current which is independent of said first constant current stage;

a switching stage governed by at least one latch signal to operate between two mutually exclusive states, in one state said gain stage being rendered operative by conducting current between said gain stage and said second constant current stage and in said other state, said latch stage being rendered operative by conducting current between said latch stage and said second constant current stage; and at least one buffer stage for buffering said drive current signal to generate said output signal.

2. The comparator in accordance with claim 1 wherein the latch stage is coupled to the buffer stage and when selected for operation, is governed by a signal, generated by the buffer stage and representative of the output signal to sustain the drive current signal in a state for latching the output signal.

3. The comparator in accordance with claim 2, wherein said buffer stage includes dual generating means, driven commonly by the drive current signal, to generate both the output signal and the signal representative thereof for feedback to the latch stage.

4. The comparator in accordance with claim 1 wherein the input stage includes a differential pair of transistors being driven by the respectively corresponding pair of input signals to generate two intermediate current signals, wherein the gain stage includes a Gilbert gain stage transistor structure for amplifying, upon selection, the pair of intermediate current signals to form a corresponding pair of drive current signals; and including a pair of buffer stages corresponding to said drive current signals, each buffer stage includes a resistor for converting the corresponding drive current signal to a drive voltage signal and an emitter follower transistor for buffering the drive voltage signal to form the output signal associated therewith.

5. The comparator in accordance with claim 4 wherein the latch stage includes a differential pair of transistors, each transistor being coupled to a corresponding output emitter follower transistor and to the voltage conversion resistor associated therewith; and wherein upon selection, said pair of latch stage transistors being operative to sustain the drive current signals at the voltage conversion resistors according to the states of the output signals.

6. The comparator in accordance with claim 5 wherein the emitter follower transistors each include dual emitters which are commonly driven by their corresponding drive voltage signals, the signal rendered at one emitter being the output signal and the signal rendered at the other emitter being representative of the output signal, said other emitter of each transistor being coupled to the base of a corresponding transistor of the latch stage differential pair for operation thereof upon selection.

7. A latching type comparator operative in one state to generate at least one output signal in response to a comparison of a pair of input signals and operative in another state to secure the state of said output signal unresponsive to said comparison of the input signals, said comparator comprising:

an input stage governed by said pair of input signals to generate at least one intermediate signal representative of the comparison of said input signals;

a gain stage selectively operative in response to said generated intermediate signal to generate a drive signal which is an amplification of said intermediate signal;

a latch stage selectively operative to sustain said generated drive signal according to the state of said output signal independent of said generated intermediate signal;

a switching stage governed by at least one latch signal to operate between two mutually exclusive states, in one state said gain stage being rendered operative and in said other state, said latch stage being rendered operative; and at least one buffer stage for buffering said drive signal to generate said output signal, said buffer stage including dual generating means, driven commonly by said drive signal, to generate both the output signal and a signal representative thereof for feedback to said latch stage, said latch stage being coupled to said buffer stage and when selected for operation being governed by said representative output signal.

8. The comparator in accordance with claim 7 wherein the input stage includes means for generating at leastone intermediate current signal; wherein the gain stage is operative upon selection to amplify said intermediate current signal to form a drive current signal; and wherein the buffer stage includes a means for converting said drive current signal to a drive voltage signal, and a voltage follower stage for buffering said voltage drive signal to form both the output signal and the signal representative thereof.

9. The comparator in accordance with claim 7 wherein the input stage includes a differential pair of transistors being driven by the respectively corresponding pair of input signals to generate two intermediate current signals, wherein the gain stage includes a Gilbert gain stage transistor structure for amplifying, upon selection, the pair of intermediate current signals to form a corresponding pair of drive current signals; and including a pair of buffer stages corresponding to said drive current signals, each buffer stage includes a resistor for converting the corresponding drive current signal to a drive voltage signal and a dual emitter follower transistor for buffering the drive voltage signal to form both the output and output representative signals associated therewith.

10. The comparator in accordance with claim 9 wherein the latch stage includes a differential pair of transistors, each transistor being coupled to a corresponding output of the dual emitter follower transistor and to the voltage conversion resistor associated therewith; and wherein upon selection, said pair of latch stage transistors being operative to sustain the drive current signals at the voltage conversion resistors according to the states of the output signals.

* * * * *